(12) United States Patent
Yoshizawa

(10) Patent No.: US 6,204,561 B1
(45) Date of Patent: Mar. 20, 2001

(54) SEMICONDUCTOR DEVICE HAVING TWO-LAYER CONTACT

(75) Inventor: Shunichi Yoshizawa, Tokyo (JP)

(73) Assignee: Nippon Steel Corporation, Tokyo (JP)

( * ) Notice: Subject to any disclaimer, the term of this patent is extended or adjusted under 35 U.S.C. 154(b) by 0 days.

(21) Appl. No.: 08/745,274

(22) Filed: Nov. 8, 1996

(30) Foreign Application Priority Data

Nov. 10, 1995 (JP) .................................................... 7-317342

(51) Int. Cl.[7] .......................... H01L 23/48; H01L 23/52; H01L 29/40
(52) U.S. Cl. .......................... 257/751; 257/763; 257/765
(58) Field of Search .................................. 257/748, 751, 257/752, 753, 763, 775, 765; 438/672, 675, 620, 637, 645, 648

(56) References Cited

U.S. PATENT DOCUMENTS

| | | | | |
|---|---|---|---|---|
| 4,987,099 | * | 1/1991 | Flanner | 438/620 |
| 5,071,789 | * | 12/1991 | Nakata | 438/641 |
| 5,084,413 | * | 1/1992 | Fujita et al. | 438/675 |
| 5,356,830 | * | 10/1994 | Yoshikawa et al. | 438/251 |
| 5,427,981 | * | 6/1995 | Choi | 438/630 |
| 5,484,747 | * | 1/1996 | Chien | 438/644 |
| 5,486,492 | * | 1/1996 | Yamamoto et al. | 438/629 |
| 5,719,416 | * | 2/1998 | Yoshimori et al. | 257/295 |

FOREIGN PATENT DOCUMENTS 4-25159   1/1992  (JP) .
5-283536  10/1993 (JP) .

* cited by examiner

*Primary Examiner*—Olik Chaudhuri
*Assistant Examiner*—Phat X. Cao
(74) *Attorney, Agent, or Firm*—Connolly Bove Lodge & Hutz, LLP

(57) ABSTRACT

Semiconductor device and method for manufacturing the same prevent the spread of a tungsten film out of an opening portion of a contact hole when the tungsten is grown in the contact hole and avoid inferior wiring shape and inter-wiring shirt-circuit. After a titanium/titanium nitride film is formed along an inner surface of the contact hole, a photo-resist film is applied. Then, the photo-resist film is etched away until a distance from an upper end of the contact hole to the surface of photo-resist film is not smaller than one-half of a width of the contact hole when the titanium/titanium nitride film is formed. After the titanium/titanium nitride film is etched by using the photo-resist as a mask, the photo-resist film is removed and a tungsten layer is selectively grown by using the titanium/titanium nitride film as a seed.

10 Claims, 3 Drawing Sheets

SEMICONDUCTOR DEVICE HAVING TWO-LAYER CONTACT

BACKGROUND OF THE INVENTION

1. Field of the Invention

The present invention relates to a semiconductor device and to a method for manufacturing the same by selectively forming a metal thin film on a semiconductor substrate as a contact plug.

2. Description of the Related Art

As the high integration and micro miniaturization of a semiconductor device have recently been promoted, a multi-layer wiring technology becomes essential. In order to accomplish the multi-layer wiring structure, a device region of a MOS or bipolar transistor and the metal wire, or a plurality of metal wires must be interconnected through an insulation film.

In the past, in order to conduct such wiring, a desired contact hole is formed in the insulation film and a metal wire is buried in the contact hole simultaneously with the formation of an upper layer metal wire. However, recently, a diameter of the contact hole is in the order of sub-micron and an aspect ratio of the contact hole formed in the insulation layer is larger than unity. The aspect ratio is defined as a ratio of a depth to a diameter of the opening. As the aspect ratio increases, the metal wire does not fully go into the contact hole and positive connection may not be attained.

In order to avoid the above problem, a tungsten selective growth method as disclosed in JP-A-4-25159 has been proposed.

The wiring formation method of the above patent application is briefly explained. First, an insulation film is formed on a semiconductor substrate and a contact hole is formed in the insulation film. A relatively thin metal silicide film is formed on an entire surface of a semiconductor substrate as a seed for selective growth and then a photo-resist film is formed on the semi-conductor substrate, and then the photo-resist film and the metal silicide film are etched back to keep the metal silicide film only within the contact hole. After the photo-resist film remaining in the contact hole is removed, a tungsten film is selectively grown in the contact hole by using the metal silicide as the seed. Thus, a wiring layer including the tungsten film which fully fills the contact hole is formed. Since the tungsten film is hard to be formed on the insulation film, the metal silicide film is formed as the seed for the selective growth.

However, in the method of the above mentioned patent publication, since the metal silicide film remains at the opening portion of the contact hole (an upper edge of the contact hole), when the tungsten film is selectively grown in the contact hole by using the metal silicide film as the seed and the contact hole is filled with the tungsten film, the tungsten film also grows from the opening portion of the contact hole and the tungsten film spreads out of the opening portion of the contact hole. As a result, when the metal wiring is formed on the tungsten film spread out of the opening portion of the contact hole, inferior wiring shape or inter-wiring short-circuit may occur.

JP-A-5-283536 discloses a manufacturing method which prevents titanium/titanium nitride on an inner wall of a contact hole from being etched by misalignment when a conductive film formed on the contact hole is etched to form the wiring.

This method is briefly explained. After the titanium/titanium nitride is sputtered on the inner wall of the contact hole formed in an interlayer insulation film on a semiconductor substrate, tungsten is vapor-grown to fill the contact hole. Then, the surface of the interlayer insulation film is exposed by dry etching and only the titanium/titanium nitride is selectively etched to form a groove. After a silicon oxide film is vapor-grown to fill the groove, the surface of the tungsten is exposed by dry etching and a conductive film is sputtered thereon. The conductive film is dry etched by using a photo-resist as a mask to complete the wiring.

In this method, however, an area of the contact is substantially reduced by the thickness of the silicon oxide film and a higher accuracy is required for positioning when the wiring is formed on the contact hole. On the other hand, if the contact hole is enlarged accordingly, it is against the high integration of the semiconductor device. Further, a process of vapor growing the silicon oxide and a process of exposing the surface of the tungsten by the dry etching are required and it makes the manufacturing process of the semiconductor device complex.

SUMMARY OF THE INVENTION

It is an object of the present invention to provide semiconductor device and method for manufacturing the same which do not make a manufacturing process of the semiconductor device complex and do not cause inferior wiring shape or short-circuit of wiring when the semiconductor devices are highly integrated.

In order to achieve the above object, according to the present invention, the method for manufacturing a semiconductor device having an insulation film comprises the steps of forming a contact hole in the insulation film, forming a first conductive film on an entire surface including an inner surface of the contact hole, applying a film for filling the contact hole, etching the applied film until a distance from an opening portion of the contact hole to a surface of the applied film is smaller than one-half of a width of the contact hole less twice a thickness of the first conductive film while the applied film remains at a bottom of the contact hole, etching the first conductive film by using the applied film as a mask, removing the remaining applied film, and selectively growing a second conductive film to fill the contact hole by using the first conductive film remaining on the inner surface of the contact hole as a seed for the selective growth.

According to the present invention, the semiconductor device comprises a semiconductor substrate, an insulation film formed on the semiconductor substrate and having a contact hole, a first conductive film formed on an inner surface of the contact hole, a distance from an opening portion of the contact hole to an upper end of the first conductive film being no smaller than one-half of a width of the contact hole less twice of a thickness of the first conductive film and a second conductive film formed on the first conductive film to fill the contact hole.

In accordance with the present invention, in order to etch away the first conductive film (barrier layer) which serves as a seed for the selective growth of the second conductive film (plug) above the contact hole until a predetermined condition is met, the filling of the contact hole is completed before the second conductive film spreads out of the upper edge of the contact hole when the second conductive film is selectively grown in the contact hole.

When a plurality of contact holes of different widths are present, the first conductive film is etched away above the contact hole so that the predetermined condition is met for the widest contact hole. Thus, when the second conductive film is grown in the contact hole, the second conductive film does not spread out of the upper edge of any of the contact holes.

Further, since the first or second conductive film is fully filled in the contact hole, the entire area may be used as the contact and the high integration of the semiconductor device is not prevented.

DESCRIPTION OF THE PREFERRED EMBODIMENTS

Figure 1A:
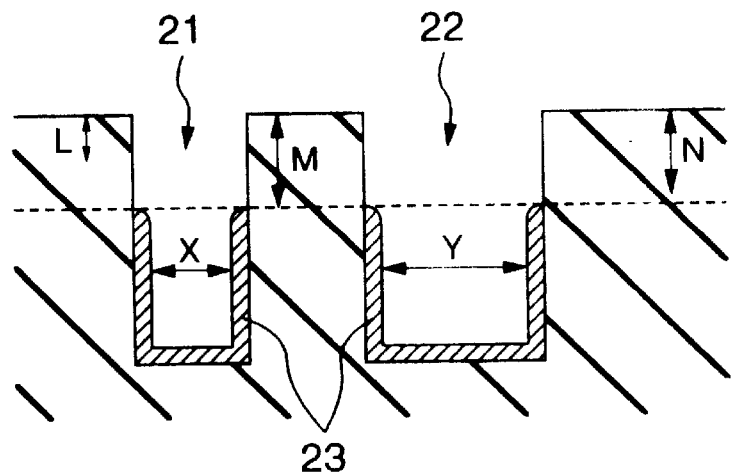
FIGS. 1A–1C show sectional views for illustrating a principle of the semiconductor device and the manufacturing method thereof according to the present invention.
Figure 1B:
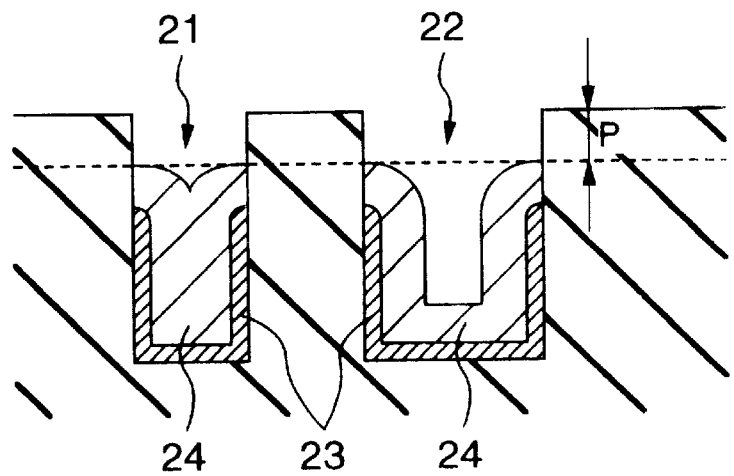
Figure 1C:
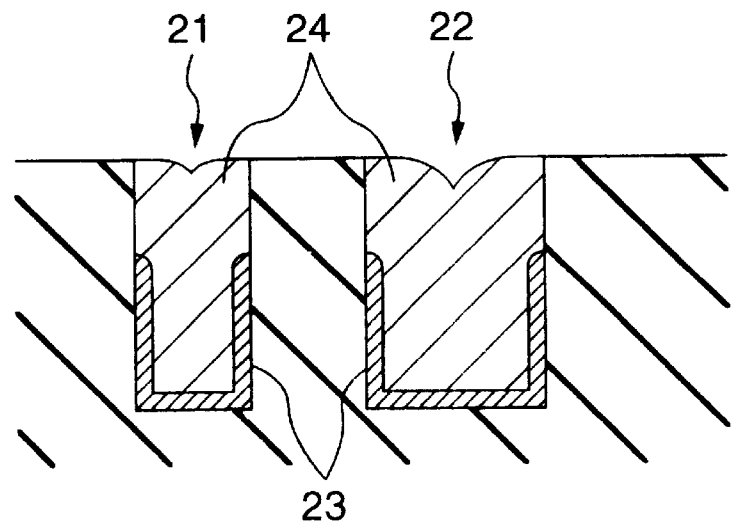

First, referring to FIGS. 1A–1C, a principle of the semiconductor device and the manufacturing method thereof according to the present invention is explained.

In FIG. 1A, distances from opening portions (upper ends) of contact holes 21 and 22 to the tops of a barrier layer 23, respectively, are M for the narrow contact hole 21 and the wider contact hole 22. The narrower contact hole 21 has a width X when the barrier layer 23 is formed, and the distance M from the upper end of the contact hole 21 to the top of the barrier layer 23 is larger than a length L which is one-half of the width X. The wider contact hole 22 has a width Y when the barrier layer 23 is formed, the distance M from the upper end of the contact hole 22 to the top of the barrier layer 23 is larger than a length N which is one-half of the width Y.

As shown in FIG. 1B, when plugs 24 are partially formed in the contact holes 21 and 22, the barrier layer 23 serves as a seed for the selective growth of the plug 24, and since the growth rates are the same, distances from the upper ends of the contact holes 21 and 22 to the top of the plug 24, respectively, are P. Since the contact hole 21 is narrower than the contact hole 22, the plugs 24 grown from the barrier layers 23 on the opposite sides of the connection layer 21 contact together and are integrated around a center before the contact hole 21 is entirely filled. Thereafter, the plug 24 growths upward substantially uniformly for the contact hole 21.

As shown in FIG. 1C, as to the contact hole 22, the plugs grown from the barrier layers 23 on the opposite sides contact each other and are integrated around the center when the contact hole 22 is fully filled. At this time, the plug 24 of the contact hole 21 also fully fills the contact hole 21, and the plug 24 does not spread out of the upper end of the contact hole 21 or 22.

When a plurality of contact holes 21 and 22 of different widths are present, the distance from the top of the barrier layer 23 to the opening portion (upper end) of the contact hole is set to be larger than the predetermined length for the widest contact hole 22 so that the plug 24 does not spread out of the opening portion (upper end) of any of the contact holes 21 and 22 when the plug 24 is selectively grown in the contact holes 21 and 22.

Referring to FIGS. 2A–2E, an embodiment of the present invention is explained in detail.

Figure 2A:
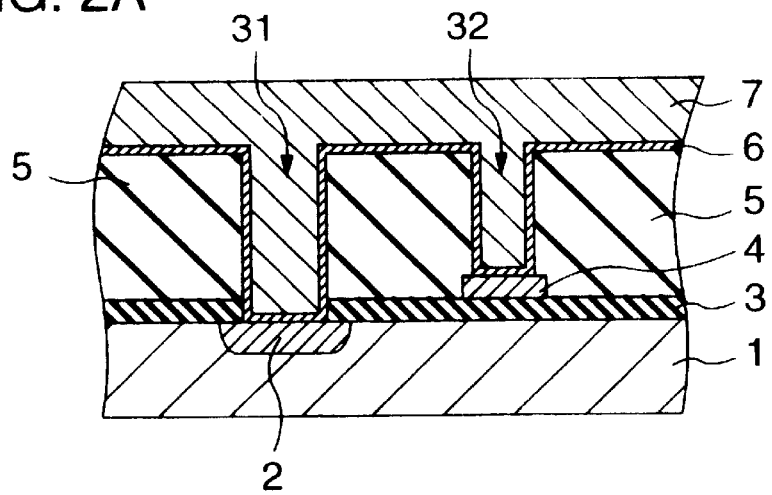
FIGS. 2A–2E show sectional views for illustrating sequential processes of the semiconductor device and the manufacturing method thereof according to the present invention.

FIGS. 2A–2E show sectional views for illustrating processes of the semiconductor device and the manufacturing method thereof according to the present invention. As shown in FIG. 2A, a gate electrode (not shown) of a MOS transistor comprising a poly-crystalline silicon film including impurities is formed in a device forming area of a semiconductor substrate 1 through a gate insulation layer (not shown), and then a pair of impurity layers (one of which is shown by 2 and the other is not shown in the sectional views of FIG. 2A) which serve as a source and a drain are formed by ion implantation into a surface of the semiconductor substrate 1 on the opposite sides of the gate electrode. Then, an interlayer insulation film 3 comprising an oxide silicon film or a BPSG (boro-phospho silicate glass) film, a PSG (phospho-silicate glass) film or a BSG (boro-silicate glass) film is formed on an entire surface of the semiconductor substrate 1 and a contact hole (not shown) which extends through the interlayer insulation film 3 and has other impurity doped layer (not shown) as a bottom is formed and then a metal wiring layer 4 which fills an inner surface of the contact hole is pattern-formed.

Then, an impurity containing fusing glass such as a BPSG film, a PSG film or a BSG film is formed on the semiconductor substrate 1, and a surface is flattened. A contact hole 31 which extends through the impurity containing fusing glass 5 and the interlayer insulation film 3 and has the impurity doped layer 2 as a bottom is formed, and a contact hole 32 which extends through the impurity containing fusing glass 5 and has the metal wiring layer 4 as a bottom is formed. In those two contact holes 31 and 32, the depth of the contact hole 31 is deeper than the depth of the contact hole 32 by the thickness of the interlayer insulation film 3 and the metal wiring layer 4. A diameter of the contact hole 31 is 0.6 $\mu$m (600 nm) and a diameter of the contact hole 32 is 0.4 $\mu$m (400 nm). Then, a titanium film and a titanium nitride film are sequentially formed on the surface of the semiconductor substrate 1 including the contact holes 31 and 32 by a sputtering method to form a titanium/titanium nitride stacked layer 6 having a film thickness of approximately 100 nm at the upper surface. The titanium/titanium nitride stacked thin film 6 is formed along the unevenness of the contact holes to prevent the contact holes 31 and 32 from being filled. Thereafter, a photo-resist film 7 is applied to the film thickness of approximately 1.5 $\mu$m as a flattening layer.

Figure 2B:
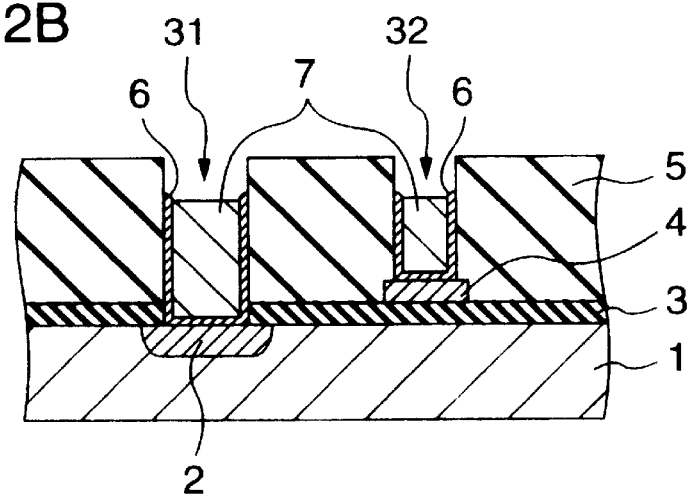

As shown in FIG. 2B, after the photo-resist layer is baked at approximately 200° C., the photo-resist layer 7 is etched back by oxygen plasma to an upper surface of the impurity containing fusing glass 5 and the inside of the contact holes 31 and 32. It is designed so that the photo-resist film 7 remains at the bottoms of the contact holes 31 and 32 and the distance from the upper end of the contact hole 31 to the surface of the photo-resist film 7 is no smaller than one-half of the width of the connection layer when the titanium/titanium nitride stacked layer 6 is formed, and preferably ⅝–⅞ and more preferably approximately ¾ when variations in the manufacturing process are taken into consideration. Thus, for the contact hole 32 which is narrower than the contact hole 31, the distance from the upper end of the contact hole 32 to the surface of the photo-resist film 7 is naturally not smaller than one-half of the width of the contact hole 32 when the titanium/titanium nitride stacked thin film 6 is formed. In the present embodiment, since the thickness of the titanium/titanium nitride stacked thin films 6 on the sides of the contact holes 31 and 32 is 50 nm, the etching is made so that the distance (depth) from the upper ends of the contact holes 31 and 32 to the surface of the photo-resist film 7 is not smaller than (600−50×2)/2=250 nm, and preferably 400 nm.

Thereafter, the titanium/titanium nitride stacked thin film 6 on the impurity containing fusing glass 5 and on the inner surfaces of the contact holes 31 and 32 which are not covered by the photo-resist film 7 is removed by ECR (electron cyclotron resonance) plasma in chlorine environment. Accordingly, the distance (depth) from the upper ends of the contact holes 31 and 32 to the top of the titanium/titanium nitride stacked thin film 6 is also 400 nm.

The etching process of the photo-resist film 7 and the etching process of the titanium/titanium nitride stacked thin film 6 described above may be replaced as follows.

After the photo-resist film 7 is baked at approximately 200° C., the photo-resist film 7 is etched back to the upper surface of the glass 5 by oxygen plasma, and then the photo-resist layer 7 in the contact holes 31 and 32 and the titanium/titanium nitride stacked thin film 6 on the upper surface of the glass 5 and on the inner surfaces of the contact holes 31 and 32 are etched away. The photo-resist film 7 and the titanium/titanium nitride stacked thin film 6 are removed to the substantially same depth because the etching rates thereof in the chlorine environment are substantially same.

Further, by making use of the fact that the etching rates of the photo-resist film 7 and the titanium/titanium nitride stacked thin film 6 in the chlorine environment are substantially the same, after the photo-resist film 7 is applied as shown in FIG. 2A, the photo-resist film 7 and the titanium/titanium nitride stacked thin film 6 may be etched to the inside of the contact holes 31 and 32 by the ECR plasma in the chlorine environment.

In those case, the distance from the upper end of the contact hole 31 to the surface of the photo-resist film 7 is made to be within the range described above.

Figure 2C:
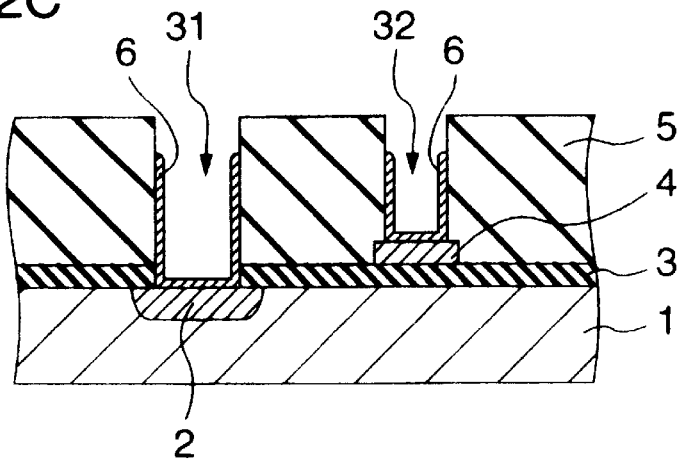

Next, as shown in FIG. 2C, the photo-resist layer 7 serving as flattening layer and remaining in the contact holes 31 and 32 is completely removed by ashing or organic cleaning. Thus, the titanium/titanium nitride stacked thin film 6 remaining on the bottom surfaces and portions of sides of the contact holes 31 and 32 is exposed.

Figure 2D:
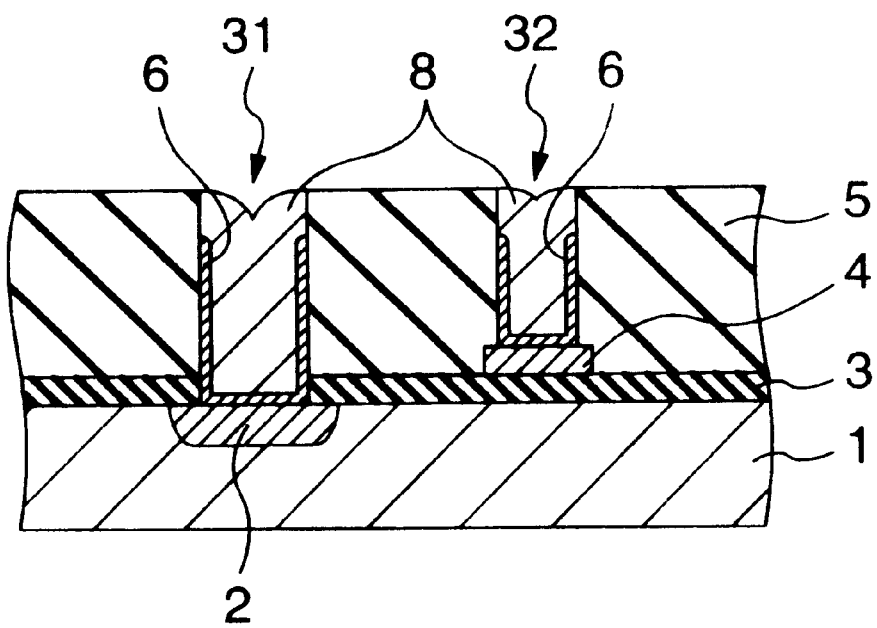

As shown in FIG. 2D, a tungsten seed (not shown) is selectively and thinly grown on only the titanium/titanium nitride stacked thin film 6 remaining in the contact holes 31 and 32 by using a tungsten CVD device, and a tungsten layer 8 is selectively grown only in the contact holes 31 and 32 by using the titanium/titanium nitride stacked thin film 6 as the seed for the selective growth at 75 sccm of tungsten hexafluoride, 450 sccm of hydrogen, temperature of 450° C. and pressure of 80 Torr, where the "sccm" is a unit of flow rate representing a volume (cc) flowing in one minute under a standard condition.

The tungsten layer 8 is grown from the surface of the titanium/titanium nitride stacked thin film 6 and completely fills the contact holes 31 and 32. Since the depth of the titanium/titanium nitride stacked thin film 6 is defined as described above, both contact holes 31 and 32 may be simultaneously filled before the top of the tungsten layer 8 grows beyond the openings of the contact holes 31 and 32. Namely, by properly selecting the growth time of the tungsten layer 8, the tungsten layer does not spread out of the contact holes 31 and 32 and the tungsten layer 8 may be formed only in the contact holes 31 and 32.

Further, since the diameter (width) of the contact hole 32 is 400−50×2=300 nm when the titanium/titanium nitride stacked thin film 6 is formed and it is smaller than that of the contact hole 31, it is filled with the tungsten layer to the center before the contact hole 31 is completely filled by the tungsten layer 8. However, since the titanium/titanium nitride stacked thin film 6 is recessed by approximately 0.4 $\mu$m (400 nm), a gap of 0.4−0.3/2=0.25 $\mu$m remains at this moment between the opening portion of the contact hole 32 and the top of the tungsten layer 8. Further, since the recess depth from the opening portion of the titanium/titanium nitride stacked thin film 6 of the contact hole 32 is the same as that of the contact hole 31, the depth from the top of the tungsten layer 8 is also 0.25 $\mu$m. Thereafter, when the tungsten layer 8 has been grown to 0.1 $\mu$m, the contact hole 31 is filled to the center and the tungsten layer 8 is further grown by 0.15 $\mu$m to fill both the contact holes 31 and 32.

Figure 2E:
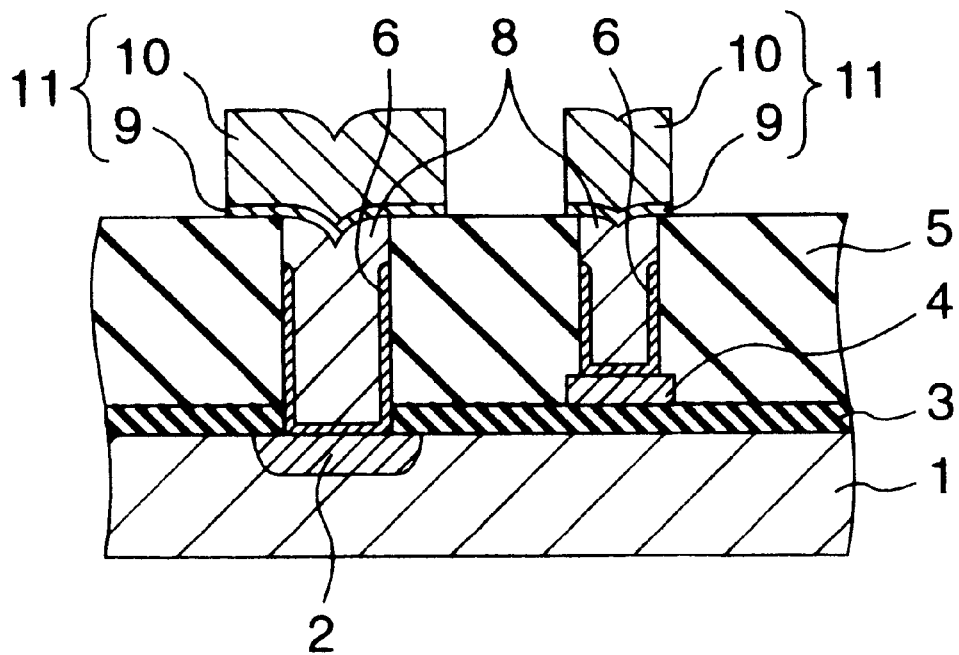

As shown in FIG. 2E, a stacked metal wiring 11 comprising a titanium film 9 and an aluminum alloy 10 is pattern-formed. By those processes, the upper and lower wirings are connected with a good characteristic and without short-circuit.

In the present embodiment, a semiconductor device having the connection between the substrate and the first layer metal wiring and the connection between the first layer metal wiring and the second layer metal wiring has been shown although the present invention may be used for any other connection between wiring layers.

In the present embodiment, although the titanium/titanium nitride stacked thin film 6 is used as the underlying layer to grow the tungsten layer 8, other thin film material may be used for growing the tungsten layer 8. For example, instead of the titanium/titanium nitride stacked thin film 6, a tungsten film, a tungsten silicide film, a molybdenum film, a molybdenum silicide film, a poly-crystalline silicon film, an amorphous silicon film or a germanium film may be used. Further, a metal silicide film, a metal film, a nitride conductive film, a silicate, a semiconductor thin film or silicon (amorphous silicon or poly-crystalline silicon) which allows the selective growth of the tungsten layer 8 may be used.

In the present embodiment, the tungsten layer 8 is used to fill the contact holes although a metal film which allows the selective growth by using the underlying film as the seed, for example, an aluminum film or an aluminum alloy may be selectively grown instead of the tungsten layer 8.

The film thicknesses and the forming methods are not limited to those described in the embodiment and various modifications may be made by those skilled in the art within the scope of the technical concept of the present invention.

In accordance with the present invention, the plug such as the tungsten does not spread out of the opening portion of the contact hole when the plug is selectively grown in the contact hole and the inferior wiring shape and the inter-wiring short-circuit are avoided.

What is claimed is:

1. A semiconductor device comprising:
   a semiconductor substrate;
   an insulation film formed on said semiconductor substrate;
   a plurality of contact holes formed through said insulation film having a plurality of different widths;
   a first conductive film formed on an inner surface of each of said plurality of contact holes;
   an end of said first conductive film formed no closer to an opening portion of said contact hole, for each of said plurality of contact holes, than a distance represented by the difference of a value equal to one-half the width of the contact hole having the largest width and a value equal to twice a thickness of said first conductive film; and
   a second conductive film formed on said first conductive film to fill each of said plurality of contact holes.

2. A semiconductor device according to claim 1, wherein:
   said insulation film includes a first insulation film and a second insulation film;
   said first insulation film includes one of a silicon oxide film, a BPSG (boro-phospho silicate glass) film, a PSG (phospho-silicate glass) film and a BSG (boro-silicate glass) film; and said second insulation film includes one of a BPSG film, a PSG film and a BSG film.

3. A semiconductor device according to claim 1, wherein:

said first conductive film includes one of a titanium/titanium nitride stacked film, a tungsten film, a tungsten silicide film, a molybdenum film, a molybdenum silicide film, a poly-crystalline silicon film, an amorphous silicon film and a germanium film; and said second conductive film includes one of a tungsten film, an aluminum film and an aluminum alloy film.

4. A semiconductor device according to claim 1 further comprising a third conductive film formed on said insulation film and connected to said second conductive film.

5. A semiconductor device according to claim 1, wherein said distance from an opening portion of said contact hole to an end of said first conductive film is equal to a value substantially ¾ of the difference given by a width of said contact hole minus twice a thickness of said first conductive film.

6. A semiconductor device comprising:

a semiconductor substrate;

a first insulation film formed on said semiconductor substrate;

a first conductive film formed on said first insulation film;

a second insulation film formed on said first conductive film;

a plurality of contact holes formed through said second insulation film having a plurality of different widths;

a second conductive film formed on an inner surface of each of said plurality of contact holes;

an end of said second conductive film formed no closer to an opening portion of said contact hole, for each of said plurality of contact holes, than a distance represented by the difference of a value equal to one-half the width of the contact hole having the largest width and a value equal to twice a thickness of said second conductive film; and a third conductive film formed on said second conductive film to fill each of said plurality of contact holes.

7. A semiconductor device according to claim 6, wherein:

said first insulation film includes one of a silicon oxide film, a BPSG (boro-phospho silicate glass) film, a PSG (phospho-silicate glass) film and a BSG (boro-silicate glass) film; and said second insulation film includes one of a BPSG film, a PSG film and a BSG film.

8. A semiconductor device according to claim 6, wherein:

said second conductive film includes one of a titanium/titanium nitride stacked film, a tungsten film, a tungsten silicide film, a molybdenum film, a molybdenum silicide film, a poly-crystalline silicon film, an amorphous silicon film and a germanium film; and said third conductive film includes one of a tungsten film, an aluminum film and an aluminum alloy film.

9. A semiconductor device according to claim 6 further comprising a fourth conductive film formed on said second insulation film and connected to said third conductive film.

10. A semiconductor device according to claim 6, wherein said distance from an opening portion of said contact hole to an end of said conductive film is equal to a value substantially ¾ of the difference given by a width of said contact hole minus twice a thickness of said second conductive film.

* * * * *